(12) United States Patent
Shinozaki et al.

(10) Patent No.: US 8,351,283 B2
(45) Date of Patent: Jan. 8, 2013

(54) SEMICONDUCTOR STORAGE DEVICE

(75) Inventors: Masao Shinozaki, Kanagawa (JP); Hajime Sato, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 398 days.

(21) Appl. No.: 12/814,478

(22) Filed: Jun. 13, 2010

(65) Prior Publication Data
US 2010/0322022 A1 Dec. 23, 2010

(30) Foreign Application Priority Data

Jun. 19, 2009 (JP) .................... 2009-146809

(51) Int. Cl.
*G11C 7/22* (2006.01)
(52) U.S. Cl. .................. 365/194; 365/189.05
(58) Field of Classification Search .............. 365/194, 365/189.05
See application file for complete search history.

(56) References Cited

U.S. PATENT DOCUMENTS

| 6,768,690 | B2 * | 7/2004 | Kwon et al. ............. 365/194 |
| 7,649,390 | B2 | 1/2010 | Shin | |
| 2006/0209620 | A1 * | 9/2006 | Deivasigamani et al. .... 365/233 |
| 2007/0069776 | A1 * | 3/2007 | Hur ......................... 327/158 |
| 2007/0152723 | A1 * | 7/2007 | Ahn et al. ................ 327/158 |

FOREIGN PATENT DOCUMENTS

| JP | 2002-100980 A | 4/2002 |
| JP | 2007-97181 A | 4/2007 |

* cited by examiner

*Primary Examiner* — Michael Tran
(74) *Attorney, Agent, or Firm* — Miles and Stockbridge P.C.

(57) ABSTRACT

The present invention is directed to realize high-speed operation and low latency of a semiconductor storage device employing the QDR method. A memory cell array, a first buffer, a second buffer, a first circuit, a second circuit, a first DLL circuit, and a second DLL circuit are provided. The first DLL circuit generates a first internal clock signal so as to reduce a phase difference between a first clock signal fetched via the first buffer and the first internal clock signal transmitted to the first circuit. The second DLL circuit generates the second internal clock signal so as to reduce a phase difference between the second clock signal fetched via the second buffer and the second internal clock signal transmitted to the second circuit. With the configuration, input setup and hold time can be shortened, and the frequency of the clock signal can be further increased.

10 Claims, 12 Drawing Sheets

SEMICONDUCTOR STORAGE DEVICE

CROSS-REFERENCE TO RELATED APPLICATIONS

The disclosure of Japanese Patent Application No. 2009-146809 filed on Jun. 19, 2009 including the specification, drawings and abstract is incorporated herein by reference in its entirety.

BACKGROUND OF THE INVENTION

The present invention relates to a semiconductor storage device and, more particularly, to a technique for realizing high-speed operation and low latency in the semiconductor storage device.

A semiconductor storage device can perform high-speed operation since it electrically records data by using semiconductor elements. In such a semiconductor storage device, there is a case where a DLL (Delay Locked Loop) circuit for adjusting timing of a clock signal is provided.

Patent document 1 describes a technique of providing a delay fixed loop assuring operation margin which allows generation of a rising/polling out enable signal by a clock signal whose timing is adjusted by a DLL circuit even when the frequency of an input clock becomes high, and realizing increased operation frequency of a DRAM (Dynamic Random Access Memory).

Patent document 2 also describes a DLL circuit. The DLL circuit includes a delay clock signal output signal and a data latch circuit. The delay clock signal output circuit outputs a reference clock signal delayed by time specified in accordance with a phase shift between a reference clock signal which is input to an input terminal and a delayed reference clock signal which is fed back from a tail end of a clock tree. In the case where delay time of the reference clock signal which is output from the delay clock signal output circuit is changed, the data latch circuit operates only for a predetermined period.

DOCUMENTS OF BACKGROUND ART

Patent document 1: Japanese Unexamined Patent Publication No. 2007-97181
Patent document 2: Japanese Unexamined Patent Publication No. 2002-100980

SUMMARY OF THE INVENTION

In a general configuration of an SRAM (Static Random Access Memory) as an example of a semiconductor storage device, a common terminal is used as a data input terminal and a data output terminal. In an SRAM of the QDR (Quad Data Rate) system, a data input terminal and a data output terminal are separated and operated at double data rates, thereby realizing high-speed operation. In the DDR operation, data is transmitted/received at each of the rising and trailing edges of a clock signal. The inventors of the present invention have examined higher-speed operation and lower latency in the QDR system.

In an SRAM of the QDR system, for example, in the case where the clock frequency is 333 MHz and the latency from address input to data output is 1.5 cycles, data has to be output in 5 ns. In general layout of an SRAM, an address input circuit for fetching an address signal and a data input buffer for fetching write data are disposed in the periphery of a chip. Consequently, it takes at least 1 ns for a clock signal which is input via an external terminal to reach a register which is built in the address input circuit and the data input buffer. In the case where the clock cycle is 2 ns, 0.2 ns is necessary for setup and hold time for a clock signal of an input signal such as an address and data. Therefore, it is necessary to delay an input signal such as an address and data by 1 ns or more before a register which is built in the address input buffer and the data input buffer. Consequently, when the frequency of a clock signal supplied to an SRAM is increased for higher speed of the SRAM, low latency cannot be maintained.

Such a problem is not considered in the patent documents 1 and 2.

An object of the present invention is to provide a technique for realizing high-speed operation and low latency of a semiconductor storage device employing the QDR method.

The above and other objects and novel features of the present invention will become apparent from the description of the specification and the appended drawings.

An outline of representative ones of inventions disclosed in the application will be briefly described as follows.

A semiconductor storage device according to the present invention includes a memory cell array, a first buffer, a second buffer, a first circuit, a second circuit, a first DLL circuit, and a second DLL circuit. The first DLL circuit generates a first internal clock signal so as to reduce a phase difference between a first clock signal fetched via the first buffer and the first internal clock signal transmitted to the first circuit. The second DLL circuit generates the second internal clock signal so as to reduce a phase difference between the second clock signal fetched via the second buffer and the second internal clock signal transmitted to the second circuit. By adjusting the timing of the first internal clock signal, the input setup and hold time can be shortened. In a state where low latency is maintained, the frequency of a clock signal can be further increased. As a result, realization of high-speed operation and low latency of the semiconductor storage device employing the QDR method is achieved.

The effects obtained by representative ones of the inventions disclosed in the application will be briefly described as follows.

The present invention can provide a technique realizing high-speed operation and low latency of a semiconductor storage device employing the QDR method.

DETAILED DESCRIPTION OF THE PREFERRED EMBODIMENTS

1. Outline of Embodiments

Figure 1:
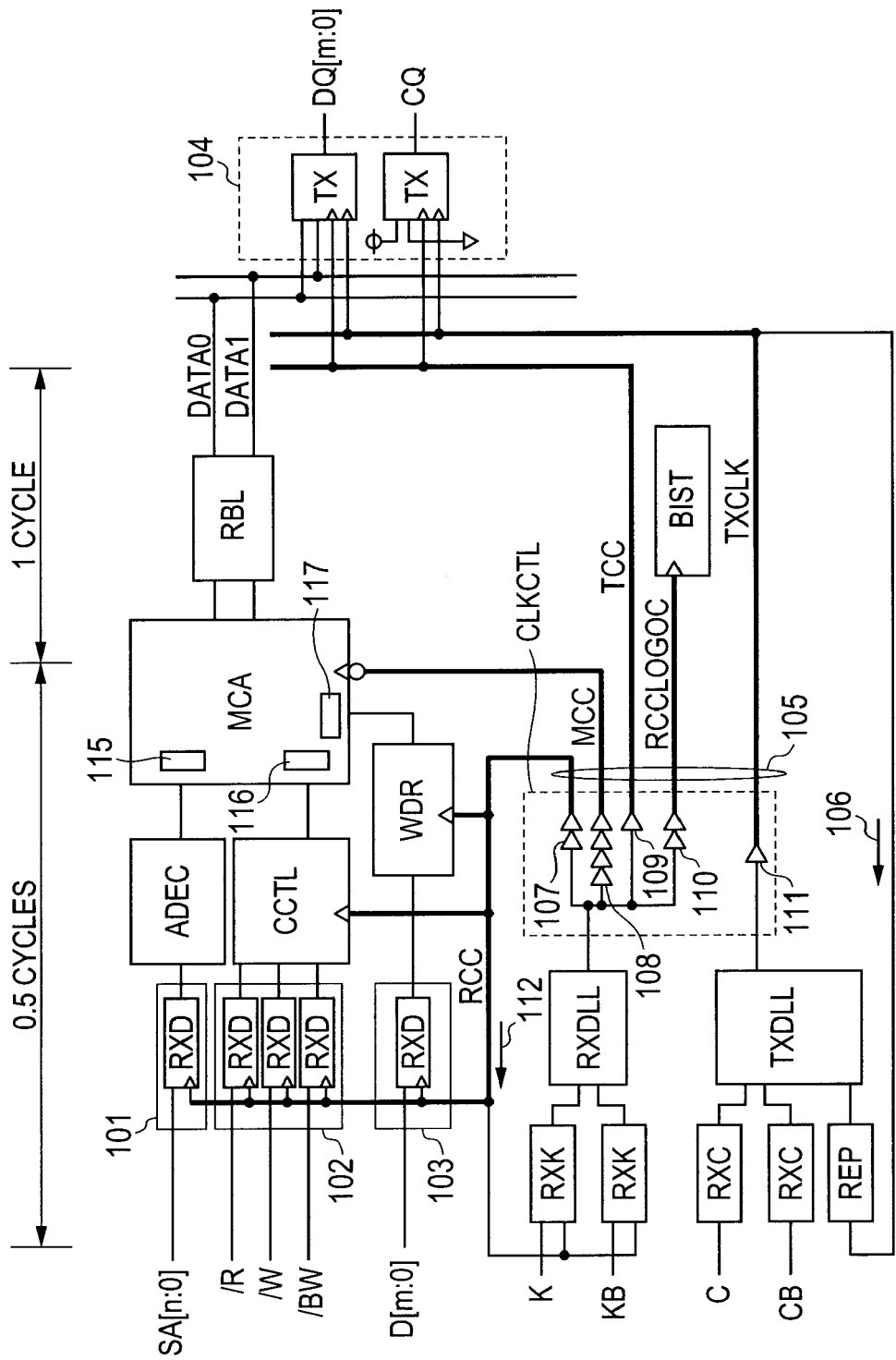
FIG. 1 is a block diagram showing a configuration example of an SRAM as an example of a semiconductor storage device according to the present invention.

First, outline of representative embodiments of the present invention disclosed in the application will be described. Reference numerals in drawings in parentheses referred to in description of the outline of the representative embodiments just illustrate components included in the concept of the components to which the reference numerals are designated.

(1) A semiconductor storage device according to a representative embodiment of the invention includes a memory cell array (MCA), a first buffer (RXK), a second buffer (RXC), first circuits (101, 102, and 103), a second circuit (104), a first DLL circuit (RXDLL), and a second DLL circuit (TXDLL). In the memory cell array, a plurality of memory cells are arranged. The first buffer fetches a first clock signal. The second buffer fetches a second clock signal which is different from the first clock signal. The first circuit fetches various signals used for writing/reading data to/from the memory cell array synchronously with a first internal clock signal. The second circuit outputs data read from the memory cell array synchronously with a second internal clock signal. The first DLL circuit generates the first internal clock signal by delaying the first clock signal so as to reduce a phase difference between the first clock signal fetched via the first buffer and the first internal clock signal transmitted to the first circuit. The second DLL circuit generates the second internal clock signal by delaying the second clock signal so as to reduce a phase difference between the second clock signal fetched via the second buffer and the second internal clock signal transmitted to the second circuit.

The first DLL circuit is provided separately from the second DLL circuit. By the first DLL circuit, the first internal clock signal is generated by delaying the first clock signal so as to reduce a phase difference between the first clock signal fetched via the first buffer and the first internal clock signal transmitted to the first circuit. By adjusting the timing of the first internal clock signal as described above, the input setup and hold time can be shortened. Thus, the frequency of the clock signal can be further increased, and the high-speed operation of the semiconductor storage device and low latency can be realized.

(2) In the device (1), a clock tree (105) for making the first internal clock signal generated by the first DLL circuit propagate in the first circuit can be included. The first DLL circuit performs phase comparison between the first internal clock signal fed back via the clock tree and the first clock signal fetched via the first buffer.

(3) In the device (2), the first buffer can be provided with a delay circuit (701, 702) capable of delaying the first internal clock signal transmitted via the clock tree and a phase comparison circuit (PD) for performing phase comparison between an output signal of the delay circuit and the first clock signal (KBint, Kint). The first circuit can be provided with a variable delay circuit (RXVDL) for finely adjusting the phase of the input first internal clock signal on the basis of a result of the phase comparison in the phase comparison circuit.

(4) In the device (3), a logic circuit (VDLLOGIC) for encoding a result of phase comparison in the phase comparison circuit can be provided. In the first circuit, delay time of the variable delay circuit is controlled by an output signal of the logic circuit.

(5) In the device (1), the first circuit can be provided with: an address input buffer (101) for fetching an address signal, a command input buffer (102) for fetching a command signal, and a data input buffer (103) for fetching data to be written to the memory cell array. The second circuit can be provided with a data output buffer capable of outputting data read from the memory cell array.

(6) The device (5) can be provided with: a command control circuit (CCTL) that controls operation of the memory cell array on the basis of a command signal fetched via the command input buffer; and a write data register (WDR) for holding write data fetched via the data input buffer. The command control circuit and the write data register can be operated synchronously with the first internal clock signal.

(7) The device (5) can be provided with a clock controller (CLKCTL) provided between the first and second DLL circuits and the first and second circuits and capable of changing delay time of the first internal clock signal and delay time of the second internal clock signal in accordance with a latency selection signal.

(8) The device (5) can be provided with: a command control circuit (CCTL) for controlling operation of the memory cell array on the basis of a command signal fetched via the command input buffer; and a write data register (WDR) for holding write data fetched via the data input buffer. The command control circuit and the write data register can be operated synchronously with the second internal clock signal.

(9) In the device (1), the memory cell array can be provided with: a first register (115) that holds an output signal of the address decoder synchronously with a clock signal for the memory cell array obtained by delaying an output signal of the first DLL circuit by predetermined time; and a second register (116) that holds an output signal of the command control circuit synchronously with the memory cell array clock signal. Further, the memory cell array can be provided with a third register (117) that holds an output signal of the write data register synchronously with the memory cell array clock signal.

(10) The device (1) can be provided with: a first power supply pad (P22, P23) for fetching power supply voltage for operating the first DLL circuit; and a second power supply pad (P12, P13) for fetching power supply voltage for operating the second DLL circuit. The first DLL circuit is disposed near the first power supply pad, and the second DLL circuit is disposed near the second power supply pad.

2. Details of Embodiments

Embodiments will be described more specifically.

First Embodiment

FIG. 1 shows an SRAM as an example of the semiconductor storage device according to the invention.

The SRAM shown in FIG. 1 is, although not limited, formed on a semiconductor substrate as one of single crystal silicon substrates by the known semiconductor integrated circuit manufacturing technique.

An address input buffer 101 is provided, which includes an input circuit RXD for fetching an address signal input via an external terminal synchronously with an internal clock signal RCC. A command input buffer 102 is provided, which includes a plurality of input circuits RXD for fetching various command signals input via external terminals synchronously with the internal clock signal RCC. The various command signals include a read signal /R instructing reading ("/" indicates an active low signal), a write signal /W instructing writing, and a bite write signal /BW instructing byte writing. A data input buffer 103 is provided and includes an input circuit RXD for fetching data D[m:0] input via an external terminal synchronously with the internal clock signal RCC. An address decoder ADEC is provided, which decodes an address signal transmitted via the address input buffer 101. The signal decoded by the address decoder ADEC is transmitted to a memory cell array at the post stage. A command control circuit CCTL is provided, which fetches the various command signals transmitted via the command input buffer 102 synchronously with an internal clock signal and generates various control signals for controlling the operation of a memory cell array MCA on the basis of the various command signals. A write data register WDR is provided, which temporarily holds data transmitted via the data input buffer 103 synchronously with the internal clock signal RCC. The memory cell array MCA includes a plurality of memory blocks formed by arranging a plurality of static memory cells in matrix, and registers 115, 116, and 117 each fetching signals at the trailing timing of the internal clock signal MCC. The register 115 fetches an output signal of the address decoder ADEC synchronously with the internal clock signal MCC. The register 116 fetches an output signal of the command control circuit CCTL synchronously with the internal clock signal MCC. The register 117 fetches an output signal of the write data register WDR synchronously with the internal clock signal MCC. A read circuit RBL is provided, which includes a sense amplifier used for reading data stored in the memory cell array MCA. Outputs of the read circuit RBL are read data DATA0 and DATA1 of complementary level. A data output buffer 104 includes two buffers TX which fetch the read data DATA0 and DATA1 of the complementary level output from the read circuit RBL and output the read data to the outside. Output data DQ[m:0] is output from one of the buffers TX and a clock signal CQ for synchronization is output from the other buffer TX.

Input clock signals K and KB and output clock signals C and CB are input from the outside. The clock signals K and KB are at complementary level that their phases are shifted by half cycle from each other, and the clock signals C and CB are at the complementary level that their phases are shifted by half cycle from each other. The clock signals K and C have the same frequency but different phases. Two clock input circuits RXK are provided, via which the clock signals K and KB are fetched. Two clock input circuits RXC are provided, via which the clock signals C and CB are fetched. An input DLL circuit RXDLL is provided, which generates an internal clock signal by delaying the clock signals K and KB so as to reduce the phase difference between the clock signals K and KB transmitted via the clock input circuit RXK and the internal clock signal RCC transmitted via the feedback path 112. An output DLL circuit TXDLL is provided, which generates an internal clock signal by delaying the clock signals C and CB so as to reduce the phase difference between the clock signals C and CB transmitted via the clock input circuit RXC and the internal clock signal TXCLK transmitted via a feedback path 106 and a replica circuit REP. A clock control circuit CLKCTL includes delay circuits 107, 108, 109, 110, and 111 for adjusting timings of the internal clock signals RCC, TCC, RCCLOGIC, and TXCLK by properly delaying output signals of the input DLL circuit RXDLL and the output DLL circuit TXDLL. The delay circuits 107, 108, 109, 110, and 111 are formed by serially coupling single or plural buffers. The larger the number of buffers coupled in series is, the longer the delay time is. In the configuration example shown in FIG. 1, delay time in the delay circuit 108 is the longest, delay time in the delay circuits 107 and 110 is the second longest, and delay time in the delay circuits 109 and 111 is the shortest. The output signal of the input DLL circuit RXDLL is delayed by the delay circuit 107 and, after that, transmitted as the internal clock signal RCC via a clock tree 105 to the address input buffer 101, the command input buffer 102, the data input buffer 103, the command control circuit CCTL, and the write data register WDR. The output signal of the input DLL circuit RXDLL is delayed by the delay circuit 108 and, after that, transmitted as the internal clock signal MCC to the memory cell array MCA via the clock tree 105. The output signal of the input DLL circuit RXDLL is delayed by the delay circuit 109 and, after that, transmitted as the internal clock signal TCC to the data output buffer 104 via the clock tree 105. The output signal of the input DLL circuit RXDLL is delayed by the delay circuit 110 and, after that, transmitted as the internal clock signal RCCLOGIC to a self diagnosis circuit BIST via the clock tree 105. The output signal of the output DLL circuit TXDLL is delayed by the delay circuit 111 and, after that, transmitted as the internal clock signal TXCLK to the data output buffer 104 via the clock tree 105.

The self diagnosis circuit BIST is a circuit realizing a tester function of generating a test pattern and comparing between an output and an expectation value on the chip. As a test pattern generator, a pseudorandom number generator is used. Comparison with an expectation value is performed after compression of an output of a circuit to be tested. As an output response compressor, an MISR (Multiple Input Signature Register) can be used. A pattern generator is coupled at the entrance of a scan chain, and a random pattern is input via the scan chain. An output from the circuit is input to the MISR. In such a self diagnosis circuit BIST, the internal clock signal RCCLOGIC is used in generation of a test pattern and the scan chain.

Figure 2:
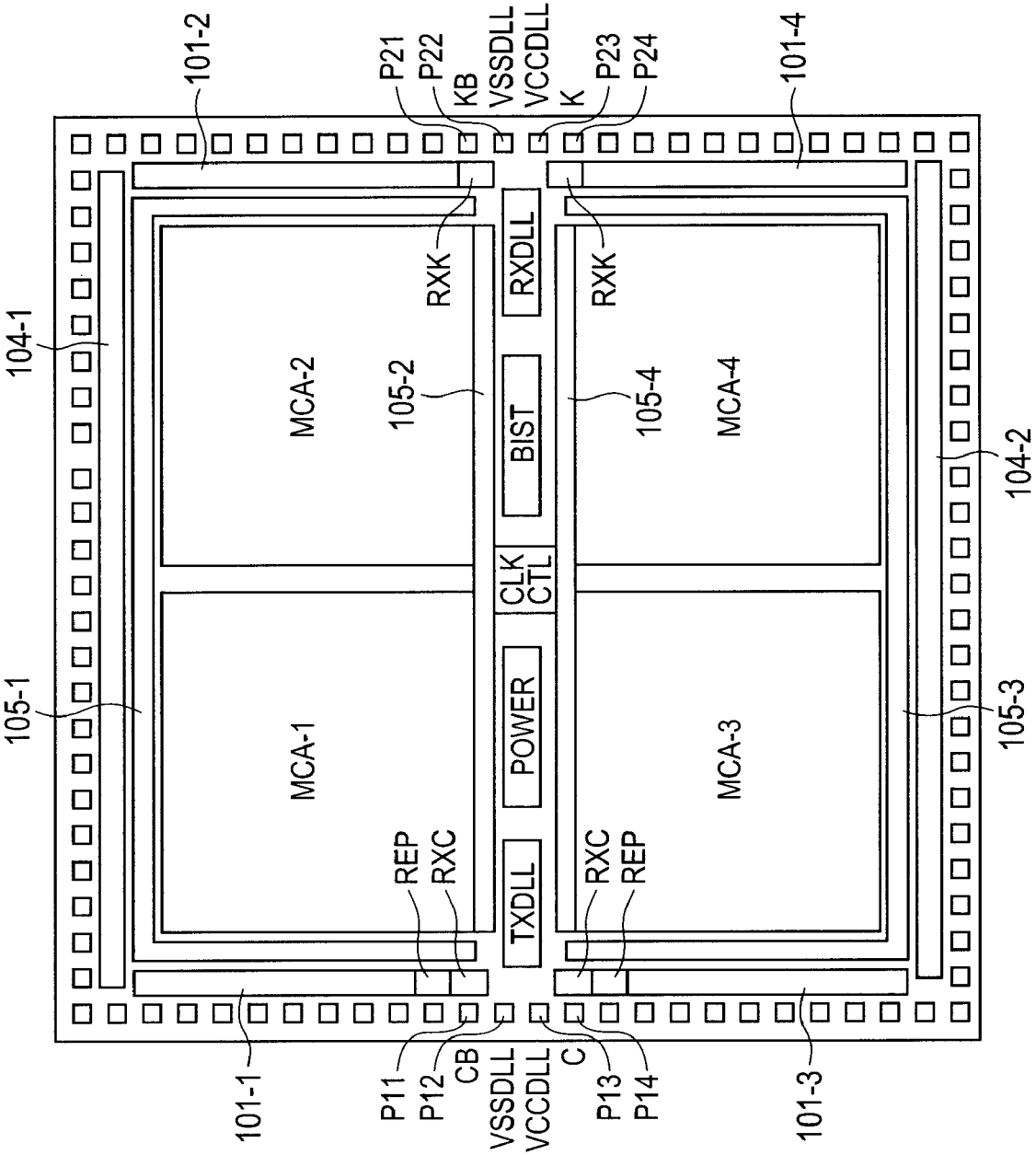
FIG. 2 is an explanatory diagram showing an example of chip layout in the SRAM.

FIG. 2 shows an example of the chip layout of the SRAM.

The memory cell array MCA includes four memory blocks MCA-1, MCA-2, MCA-3, and MCA-4. In a gap between the memory blocks MCA-1 and MCA-2 and the memory blocks MCA-3 and MCA-4, various peripheral circuits are disposed. The various peripheral circuits include the output DLL circuit TXDLL, a power supply circuit POWER, the clock control circuit CLKCTL, the self diagnosis circuit BIST, and the input DLL circuit RXDLL. Clock trees 105-1 and 105-2 are disposed so as to surround the memory blocks MCA-1 and MCA-2. Address input buffers 101-1 and 101-2, a data input buffer 104-1, the replica circuit REP, and the clock input circuits RXC and RXK are disposed so as to surround the clock tree 105-1. Clock trees 105-3 and 105-4 are disposed so as to surround the memory blocks MCA-3 and MCA-4. Address input buffers 101-3 and 101-4, a data input buffer 104-2, the replica circuit REP, and the clock input circuits RXC and RXK are disposed so as to surround the clock tree 105-3. A plurality of pads are arranged at the periphery of the chip. The plural pads are coupled to terminals provided for a package on which the chip is mounted. Via the pads, various signals are input/output and the power supply voltage is fetched. The pads are assigned and layout of the circuit is designed so as to shorten the distance between the pad and a circuit to which the pad is coupled. For example, power supply pads P12 and P13 for fetching operation power supply voltages VSSDLL and VCCDLL for the output DLL circuit TXDLL are provided, and the output DLL circuit TXDLL is disposed near the power supply pads P12 and P13. Similarly, power supply pads P22 and P23 for fetching operation power supply voltages VSSDLL and VCCDLL for the input DLL circuit RXDLL are provided, and the input DLL circuit RXDLL is disposed near the power supply pads P22 and P23. By such arrangement, power supply lines for supplying the operation power supply voltages VSSDLL and VCCDLL to the output DLL circuit TXDLL and the input DLL circuit RXDLL can be shortened. Undesired noise can be suppressed from entering the output DLL circuit TXDLL and the input DLL circuit RXDLL via the power supply lines. The clock input circuit RXC is disposed near an input pad P11 for fetching the clock signal CB, and the clock input circuit RXC is disposed near an input pad P14 for fetching the clock signal C. The clock input circuit RXK is disposed near an input pad P21 for fetching the clock signal KB, and the clock input circuit RXK is disposed near an input pad P24 for fetching the clock signal K. Further, pads near the address input buffers 101, 102, 103, and 104 are assigned for address input, and pads near the data input buffers 104-a and 104-2 are assigned for data input.

Figure 7:
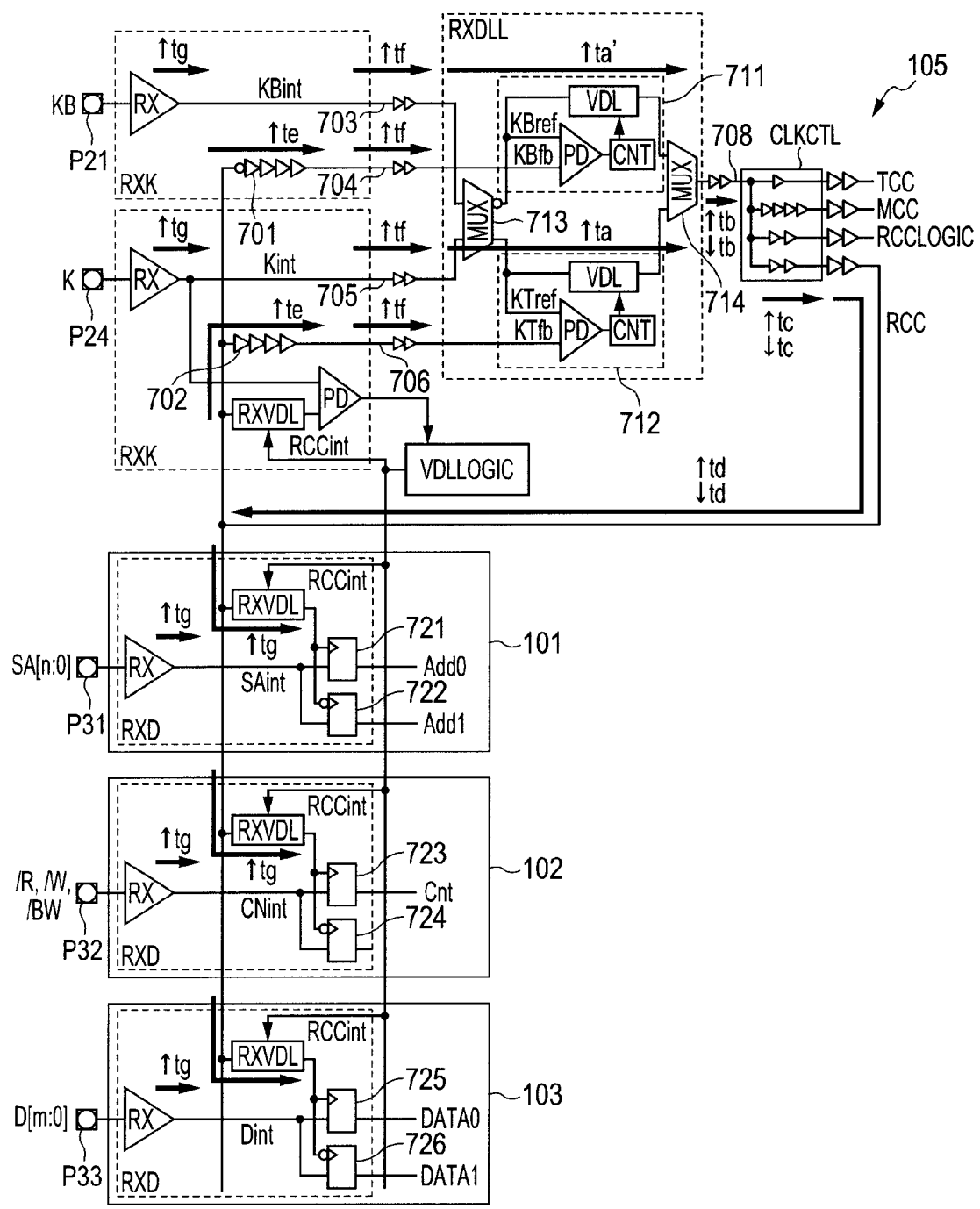
FIG. 7 is a circuit diagram showing a configuration example of main components in the SRAM illustrated in FIG. 1.

FIG. 7 shows a configuration example of the clock input circuit RXK, the input DLL circuit RXDLL, the clock control circuit CLKCTL, the address input buffer 101, and the data input buffer 103.

In the diagram, a reference code designated with an up-arrow (↑) shows delay time from the rising edge of an input signal to the rising edge of an output signal in a target circuit. A reference code designated with a down-arrow (↓) shows delay time from the trailing edge of an input signal to the trailing edge of an output signal in the target circuit. A thick-line arrow indicates the transmission direction of a signal in the target circuit.

The clock input circuit RXK for fetching the clock signal KB transmitted via the pad includes a buffer RX to which the clock signal KB is input and a delay circuit 701 for fetching the internal clock signal RCC transmitted via the clock tree 105. An output signal KBint of the buffer RX is transmitted to the input DLL circuit RXDLL via a signal line 703. An output signal of the delay circuit 701 is transmitted to the input DLL circuit RXDLL via the signal line 703.

The clock input circuit RXK for fetching the clock signal K transmitted via the pad includes a buffer RX to which the clock signal K is input, a delay circuit 702 to which an output signal Kint of the buffer RX is transmitted, a variable delay circuit RXVDL for fetching the internal clock signal RCC transmitted via the clock tree 105, and a phase comparison circuit PD for performing phase comparison. The output signal Kint of the buffer RX is transmitted to the input DLL circuit RXDLL via a signal line 705. An output signal of the delay circuit 702 is transmitted to the input DLL circuit RXDLL via a signal line 706. The phase comparison circuit PD obtains a phase difference by comparing the phase of an output signal RCCint of the variable delay circuit RXVDL with the output signal Kint of the buffer RX. The result of the phase comparison is transmitted to the logic circuit VDLLOGIC and is encoded there.

The input DLL circuit RXDLL includes multiplexers (MUX) 713 and 714 for fetching signals transmitted via the signal lines 703 and 705, a first adjustment circuit 711 for adjusting the timing of an inversion output signal of the multiplexer 713, and a second adjustment circuit 712 for adjusting the timing of a non-inversion output signal of the multiplexer 713. The multiplexer 713 has the inversion output terminal and the non-inversion output terminal. An output signal of the non-inversion output terminal of the multiplexer 713 rises synchronously with the rising edge of a signal of the signal line 705 and trails synchronously with the rising edge of a signal of the signal line 703. An output signal of the non-inversion output terminal of the multiplexer 713 trails synchronously with the rising edge of a signal of the signal line 705 and rises synchronously with the rising edge of a signal of the signal line 703. The first adjustment circuit 711 includes a variable delay circuit VDL for delaying an inversion output signal KBref of the multiplexer 713, a phase comparison circuit PD for performing phase comparison between the inversion output signal KBref of the multiplexer 713 and a signal KBfb of the signal line 704, and a control circuit CNT for controlling delay time in the variable delay circuit VDL on the basis of the phase comparison result in the phase comparison circuit PD. The control circuit CNT controls delay time in the variable delay circuit VDL so as to reduce the phase difference between the inversion output signal KBref of the multiplexer 713 and the signal KBfb of the signal line 704. An output signal of the variable delay circuit VDL is output via the multiplexer 714. The second adjustment circuit 712 includes the variable delay circuit VDL for delaying the non-inversion output signal KTref of the multiplexer 713, the phase comparison circuit PD for performing phase comparison between the non-inversion output signal KTref of the multiplexer 713 and the signal KTfb of the signal line 706, and a control circuit CNT for controlling delay time in the variable delay circuit VDL on the basis of a phase comparison result of the phase comparison circuit PD. The control circuit CNT controls delay time in the variable delay circuit VDL so as to reduce the phase difference between the non-inversion output signal KTref of the multiplexer 713 and the signal KTfb of the signal line 706. An output signal of the variable delay circuit VDL is output via the multiplexer 714. An output signal of the multiplexer 714 rises synchronously with the rising edge of an output signal of the second adjustment circuit 712, and trails synchronously with the rising edge of an output signal of the first adjustment circuit 711.

The address input buffer 101 includes a plurality of input circuits RXD corresponding to the bit configuration of an address signal which is input. The plural input circuits RXD have the same configuration, and one of them is representatively shown in FIG. 7. The input circuit RXD includes the buffer RX to which the address signal SA is input, the variable delay circuit RXVDL for delaying the internal clock signal RCC transmitted via the clock tree 105, and registers 721 and 722 for fetching an output signal SAint of the buffer RX synchronously with an output signal RCCint of the variable delay circuit RXVDL. The register 721 fetches the output signal SAint of the buffer RX synchronously with the rising edge of the output signal RCCint of the variable delay circuit RXVDL and outputs it as Add0. The register 722 fetches the output signal Saint of the buffer RX synchronously with the trailing edge of the output signal RCCint of the variable delay circuit RXVDL and outputs it as Add1. The delay time in the variable delay circuit RXVDL is controlled by an output signal of the logic circuit VDLLOGIC.

The command input buffer 102 includes the input circuits RXD corresponding to the read signal /R, the write signal /W, and the byte write signal /BW, which have the same configuration. FIG. 7 shows one of them and only the input circuit corresponding to the read signal /R is representatively shown. The input circuit RXD for fetching the read signal /R includes the buffer RX to which the read signal /R is input, the variable delay circuit RXVDL for delaying the internal clock signal RCC transmitted via the clock tree 105, and registers 723 and 724 for fetching an output signal CNint of the buffer RX synchronously with an output signal CCint of the variable delay circuit RXVDL. The register 723 fetches the output signal CNint of the buffer RX synchronously with the rising edge of the output signal RCCint of the variable delay circuit RXVDL and outputs it as Cnt. The register 722 fetches the output signal CNint of the buffer RX synchronously with the trailing edge of the output signal of the variable delay circuit RXVDL but does not output it. The delay time in the variable delay circuit RXVDL is controlled by an output signal of the logic circuit VDLLOGIC.

The data input buffer 103 includes a plurality of input circuits RXD corresponding to the bit configuration of input data. The plural input circuits RXD have the same configuration. FIG. 7 representatively shows one of them. The input circuit RXD includes the buffer RX to which data D is input, the variable delay circuit RXVDL for delaying the internal clock signal RCC transmitted via the clock tree 105, and registers 725 and 726 for fetching an output signal Dint of the buffer RX synchronously with an output signal RCCint of the variable delay circuit RXVDL. The register 725 fetches the output signal Dint of the buffer RX synchronously with the rising edge of the output signal RCCint of the variable delay circuit RXVDL and outputs it as DATA0. The register 726 fetches the output signal Dint of the buffer RX synchronously with the trailing edge of the output signal RCCint of the variable delay circuit RXVDL and outputs it as DATA1. The delay time in the variable delay circuit RXVDL is controlled by an output signal of the logic circuit VDLLOGIC.

Figure 8:
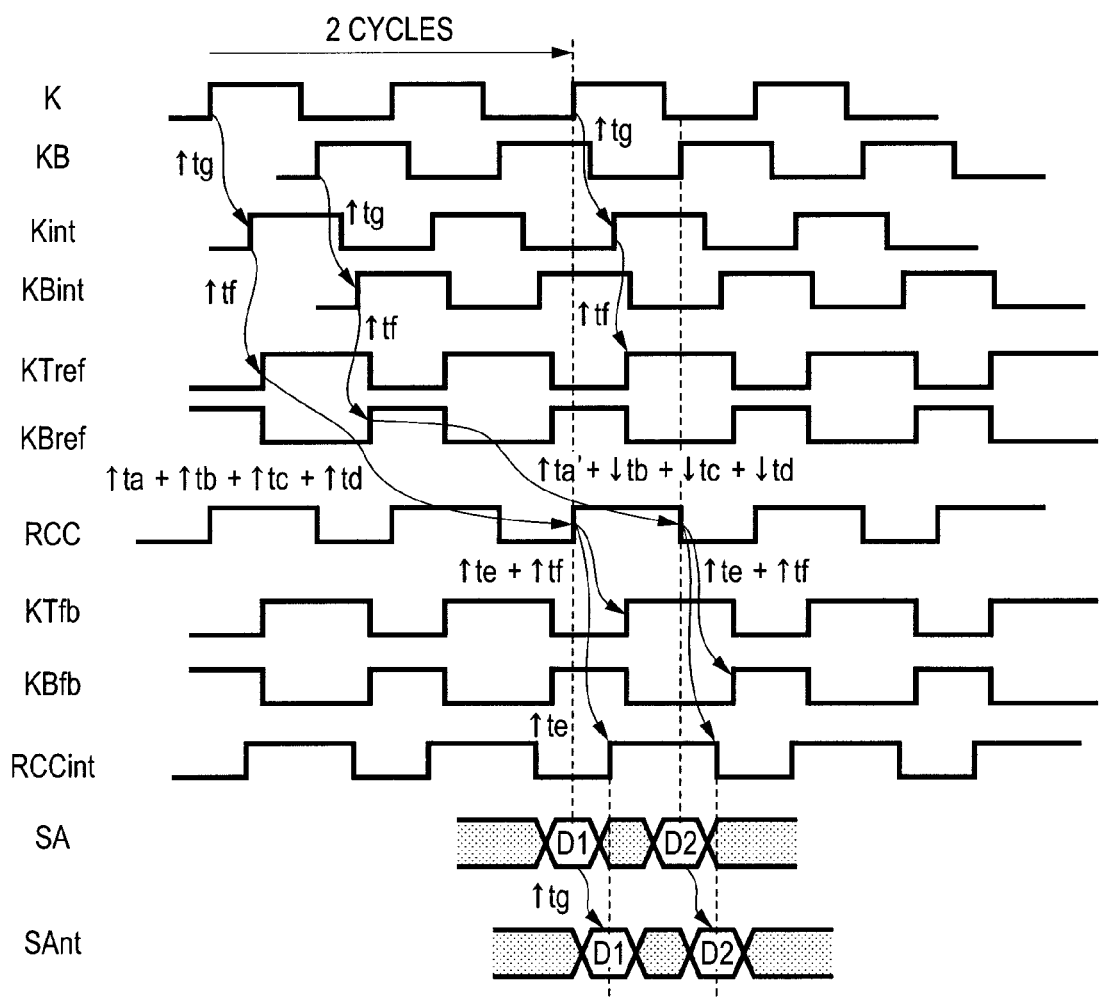
FIG. 8 is an operation timing chart of main components in FIG. 7.

FIG. 8 shows operation timings of main components in FIG. 7.

A clock signal input from the input pad P24 of the clock signal K is delayed as described below and reaches the phase comparison circuit PD in the input DLL circuit RXDLL.

The clock signal is delayed by $\uparrow tg$ in the buffer RX, delayed by $\uparrow tf$ in the signal line 705, delayed by $\uparrow ta$ in the variable delay circuit VDL of the input DLL circuit RXDLL, and delayed by $\uparrow tb$ in the signal line 708 between the input DLL circuit RXDLL and the clock control circuit CLKCTL. The signal is delayed by $\uparrow tc$ in the clock control circuit CLKCTL, delayed by $\uparrow td$ in the RCC line in the clock tree 105, delayed by $\uparrow te$ in the delay circuit 702, and delayed by $\uparrow tf$ in the signal line 706, and the resultant signal reaches as KTfb the phase comparison circuit PD in the second adjustment circuit 712.

On the other hand, a signal KTref before input to the variable delay circuit VDL is input to the input terminal on the reference side of the phase comparison circuit PD in the second adjustment circuit 712. In the phase comparison circuit PD, as shown in FIG. 8, the phase difference between KTfb and KTref reached from the waveform edge of a clock signal after two cycles of KTfb is obtained and transmitted to the control circuit CNT. On the basis of the phase difference, the delay time $\uparrow ta$ in the variable delay circuit VDL is adjusted. As a result, $\uparrow tg + \uparrow tf + \uparrow ta + \uparrow tb + \uparrow tc + \uparrow td + \uparrow te + \uparrow tf = \uparrow g + \uparrow f + 2$ cycles is satisfied.

The delay time $\uparrow te$ in the delay circuit 702 is designed to be almost equal to $\uparrow tg$. Therefore, $\uparrow tg + \uparrow tf + \uparrow ta + \uparrow tb + \uparrow tc + \uparrow td = 2$ cycles. The rising timing of the internal clock signal RCC becomes almost the same as the rising timing in the input pad P24 of the clock signal K.

Further, in the phase comparison circuit PD in the clock input circuit RXK, the phase of an output of the clock input circuit RXK and that of the output RCCint of the variable delay circuit RXVDL in the clock input circuit RXK of the internal clock signal RCC are compared with each other. The delay time in the variable delay circuit RXVDL is adjusted by the logic circuit VDLLOGIC so that their phases coincide with each other. A delay time adjustment code of the variable delay circuit RXVDL is transmitted from the logic circuit VDLLOGIC to the variable delay circuits RXVDL in the address input buffer 101, the command input buffer 102, and the data input buffer 103, and the internal clock signal RCC transmitted via the clock tree 105 is finely adjusted.

In a manner similar to the above, the trailing timing of the internal clock signal RCC can be made the same as that of the clock signal KB which is input via the input pad P21. Since rising transition time and the trailing transition time of the clock buffer vary according to process parameters and the like, $\uparrow tb$ and $\downarrow tb$, $\uparrow tc$ and $\downarrow tc$, and $\uparrow td$ and $\downarrow td$ do not always match, so that $\uparrow ta$ is not equal to $\uparrow ta'$.

Figure 9:
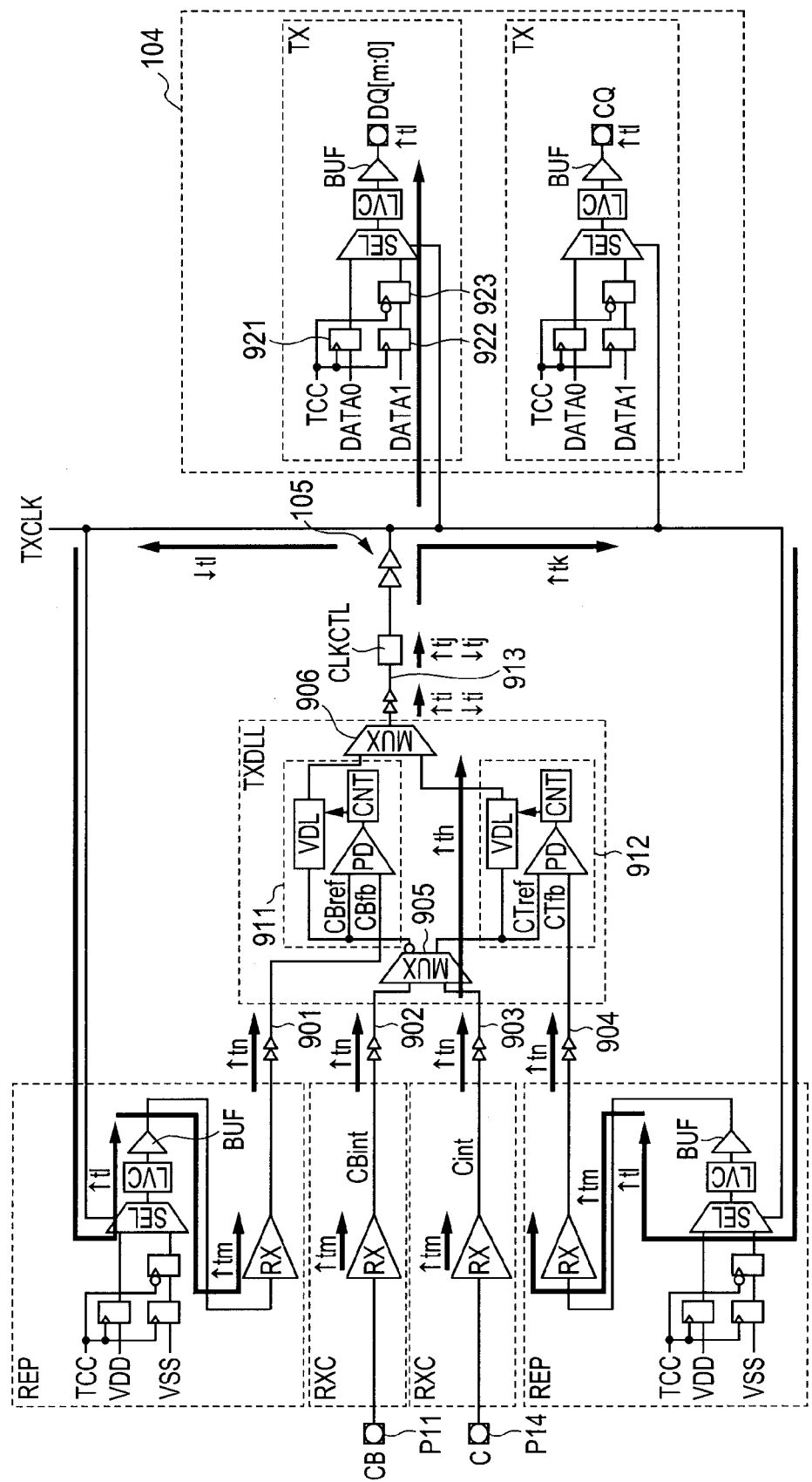
FIG. 9 is a circuit diagram showing a configuration example of main components in the SRAM illustrated in FIG. 1.

FIG. 9 shows a configuration example of the input circuit RXC, the output DLL circuit TXDLL, the data output buffer 104, and the replica circuit REP.

The clock input circuit RXC to which the clock signal CB transmitted via the pad P11 is input includes the buffer RX that fetches the clock signal CB. An output signal of the buffer RX is CBint. The clock input circuit RXC to which the clock signal C transmitted via the pad P14 is input includes the buffer RX that fetches the clock signal C. An output signal of the buffer RX is Cint. The output signal CBint of the clock input circuit RXC is transmitted to the input DLL circuit RXDLL via a signal line 902. The output signal Cint of the clock input circuit RXC is transmitted to the input DLL circuit RXDLL via a signal line 903.

The output DLL circuit TXDLL includes multiplexers 905 and 906, a first adjustment circuit 911, and a second adjustment circuit 912 and its basic configuration is similar to that of the input DLL circuit RXDLL shown in FIG. 7. The first adjustment circuit 911 adjusts the timing of an output signal CBref of the inversion output terminal of the multiplexer 905. The second adjustment circuit 912 adjusts the timing of an output signal CTref of the non-inversion output terminal of the multiplexer 905.

The first adjustment circuit 911 includes the variable delay circuit VDL that delays the inversion output signal CBref of the multiplexer 905, the phase comparison circuit PD performing phase comparison between the inversion output signal CBref of the multiplexer 713 and the signal CBfb transmitted from the replica circuit REF via the signal line 901, and the control circuit CNT that controls delay time in the variable delay circuit VDL on the basis of a result of the phase comparison in the phase comparison circuit PD. The control circuit CNT controls delay time in the variable delay circuit VDL so as to reduce the phase difference between the inversion output signal CBref of the multiplexer 713 and the signal CBfb of the signal line 901. An output signal of the variable delay circuit VDL is output via the multiplexer 906.

The second adjustment circuit 912 includes the variable delay circuit VDL that delays the non-inversion output signal CTref of the multiplexer 905, the phase comparison circuit PD performing phase comparison between the non-inversion output signal CTref of the multiplexer 713 and the signal CTfb transmitted from the replica circuit REP via the signal line 706, and the control circuit CNT that controls delay time in the variable delay circuit VDL on the basis of a result of the phase comparison in the phase comparison circuit PD. The control circuit CNT controls delay time in the variable delay circuit VDL so as to reduce the phase difference between the non-inversion output signal CTref of the multiplexer 905 and the signal CTfb of the signal line 904. An output signal of the variable delay circuit VDL is output via the multiplexer 906.

An output signal of the multiplexer 906 is transmitted to the clock control circuit CLKCTL via the signal line 913. An output signal of the clock control circuit CLKCTL is transmitted to two buffer units TX in the data output buffer 104 via the clock tree 105. The buffer unit TX that outputs DQ[m:0] includes registers 921, 922, and 923, a selector SEL, a level shifter LVC, and a buffer BUF. The register 921 fetches data DATA0 at the timing of the rising edge of the internal clock signal TCC. The register 922 fetches data DATA1 at the timing of the rising edge of the internal clock signal TCC. The register 923 fetches an output signal of the register 922 at the timing of the trailing edge of the internal clock signal TCC. The selector SEL transmits an output signal of the register 921 and an output signal of the register 923 selectively to a level shifter LVC at the post stage synchronously with the internal clock signal TXCLK. An output signal shifted to a predetermined level by the level shifter LVC is output via the buffer BUF.

The two replica circuits REP simulate delay time of TX and RXC and include a part having the same configuration as that of the buffer unit TX in the data output buffer 104 and the buffer RX to which an output signal of the part is transmitted. An output signal of the buffer RX is transmitted to the output DLL circuit TXCLL via the signal line 901 or 904.

Figure 10:
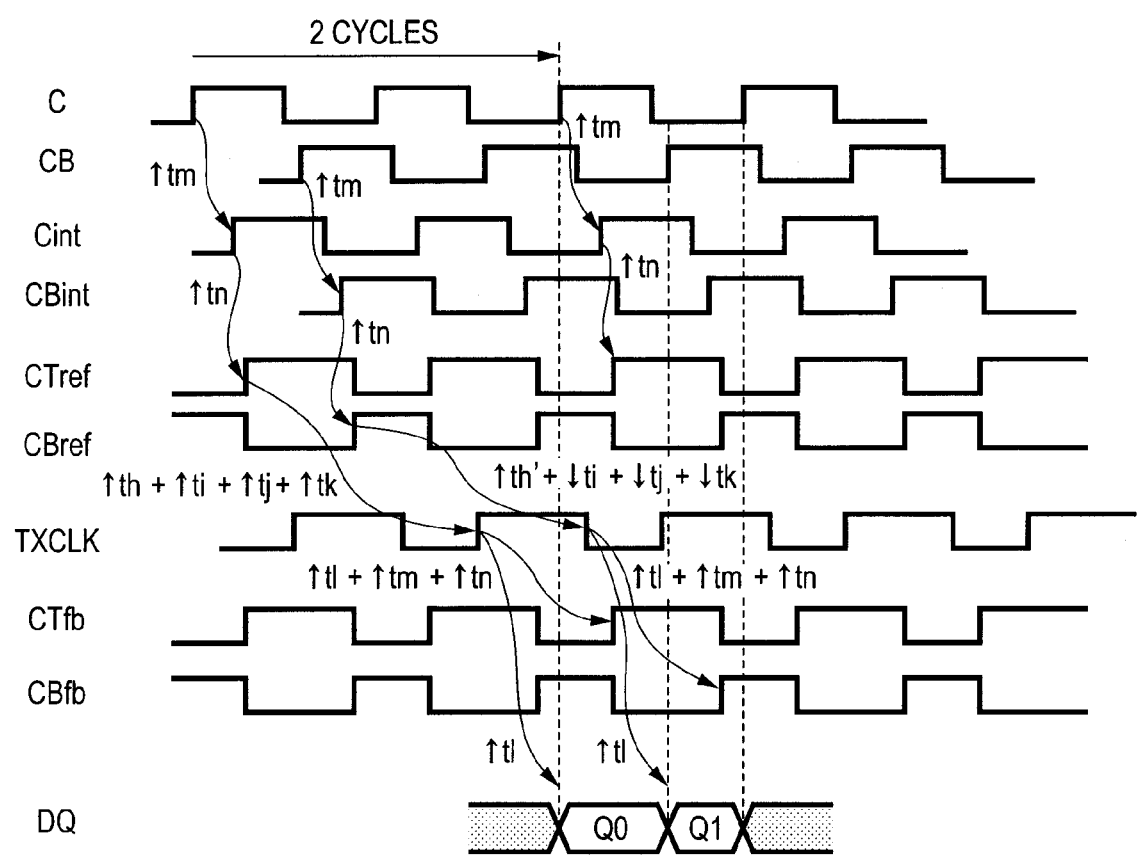
FIG. 10 is an operation timing chart of main components in FIG. 9.

The clock signal C which is input via the pad P14 is delayed by ↑tm in the clock input circuit RXC, delayed by ↑tn in the signal line 903, delayed by ↑th in the variable delay circuit VDL in the second adjustment circuit 912 in the output DLL circuit TXDLL, and delayed by ↑ti in the signal line 913. The clock signal C is delayed by ↑tj in the clock control circuit CLKCTL, delayed by ↑tk in the clock tree 105, delayed only by ↑tl+↑tm in the replica circuit REP, delayed by ↑tn in the signal line 904, and transmitted to the input terminal on the feedback side of the phase comparison circuit PD in the second adjustment circuit 912. On the other hand, a signal prior to input to the variable delay circuit VDL is transmitted to the input terminal on the reference side of the phase comparison circuit PD in the second adjustment circuit 912. In the phase comparison circuit PD in the second adjustment circuit 912, as shown in FIG. 10, the phase difference between the signal CTfb and the signal CTref reached from the clock edge after two cycles of the signal CTfb is obtained. The comparison result is transmitted to the control circuit CNT. The control circuit adjusts the delay time ↑th in the variable delay circuit VDL so as to reduce the phase difference between the signals CTfb and CTref. As a result, ↑tm+↑tn+↑th+↑ti+↑tj+↑tk+↑tl+↑tm+↑tn=↑tm+↑n+2 cycles is satisfied. It is organized as ↑tm+↑tn+↑th+↑ti+↑tj+↑tk+↑tl=2 cycles. Delay time from the clock signal C of the internal clock signal TXCLK is ↑tm+↑tn+↑th+↑ti+↑tj+↑tk, so that 2 cycles−↑tl is derived from the above equation. Delay time from the clock signal C of the output signal DQ is delay time of TXCL from C 2 cycles−↑tl+TX delay time ↑tl=2 cycles. Therefore, transition time timing of the output signal DQ becomes equal to the rising timing after two cycles of the clock signal C, so that data can be output at a proper timing.

Figure 3:
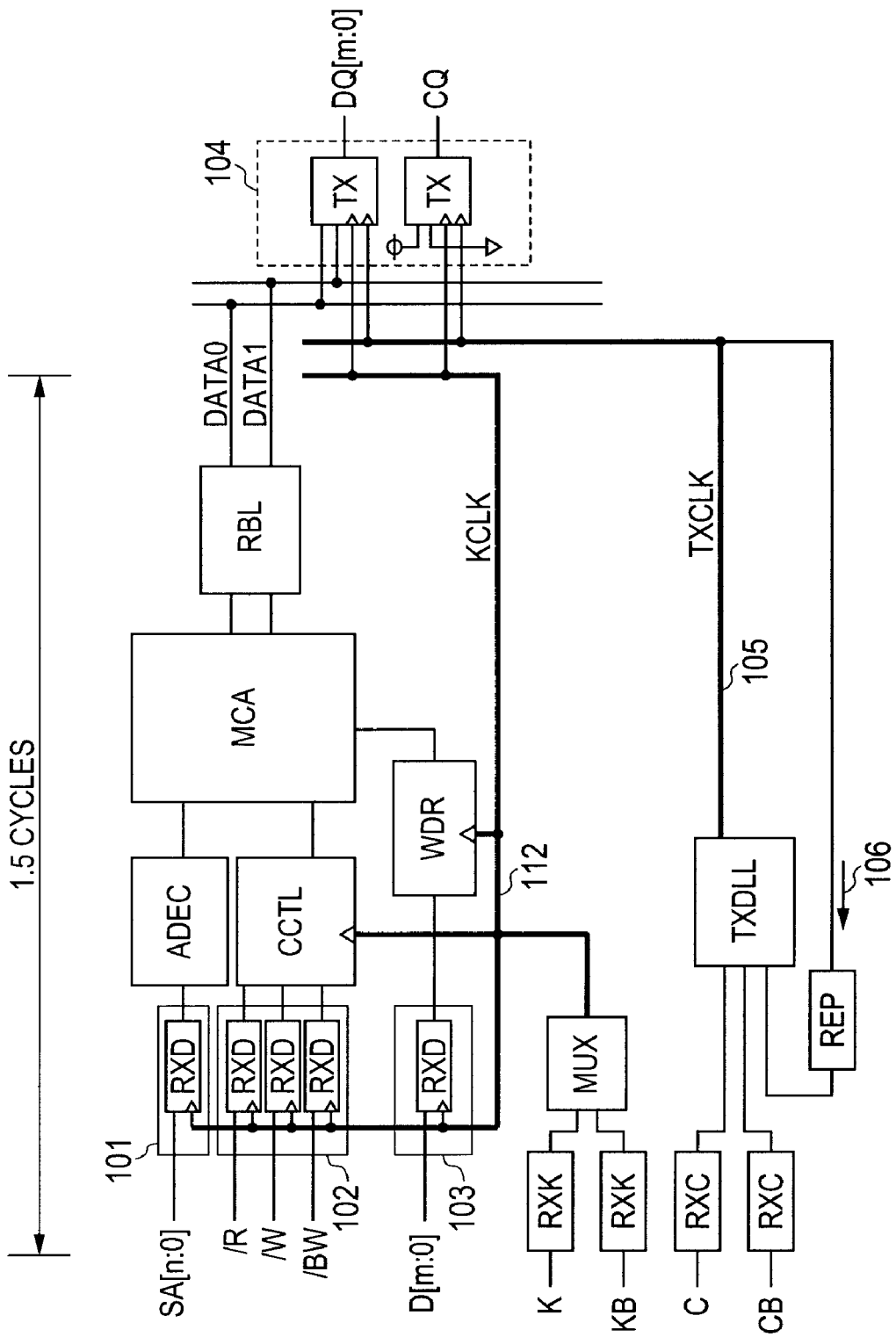
FIG. 3 is a block diagram showing a configuration example of an SRAM as an object to be compared with the SRAM illustrated in FIG. 1.
Figure 4:
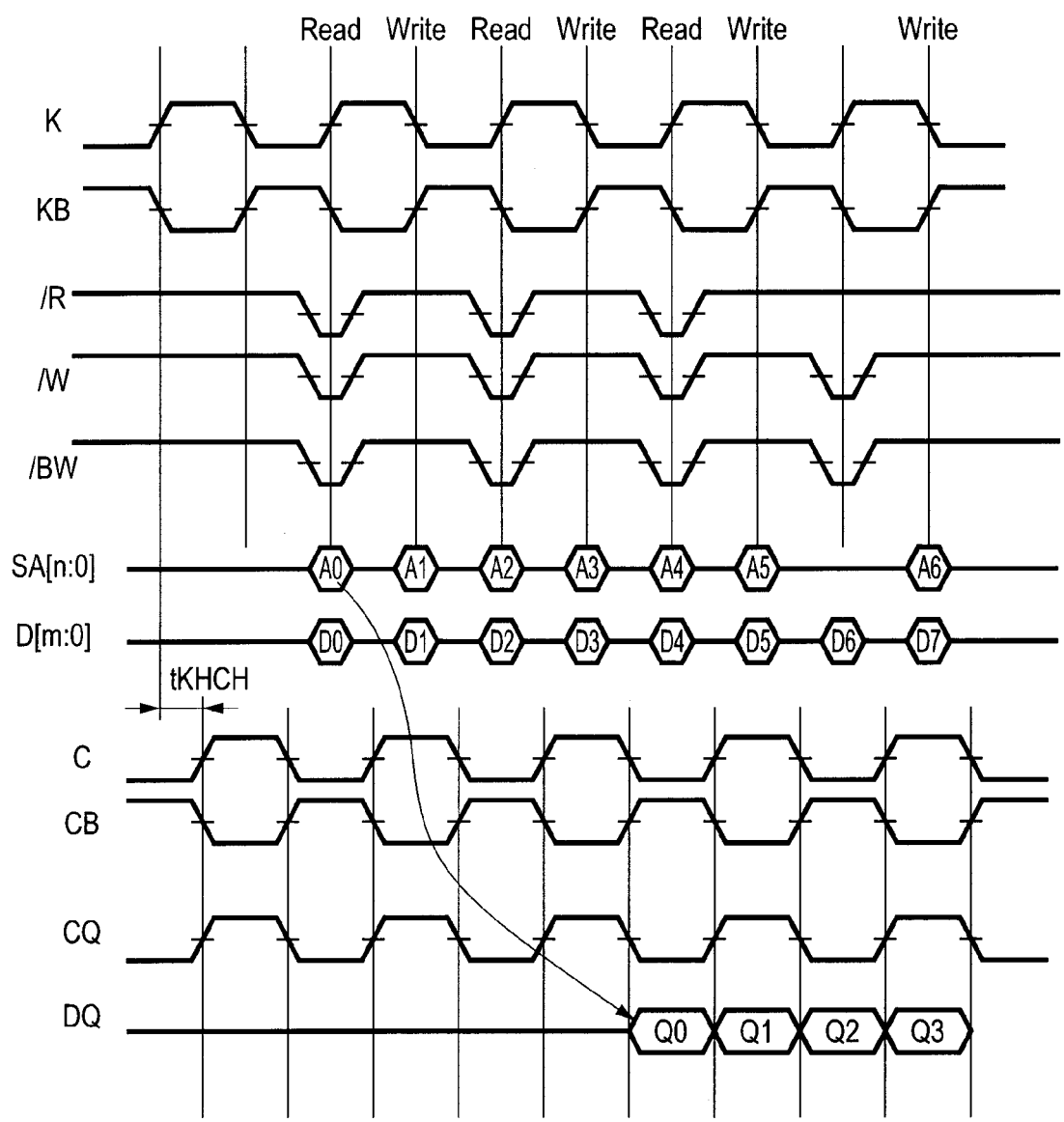
FIG. 4 is an operation timing chart of main components in FIG. 1.

FIG. 3 illustrates an SRAM to be compared with the SRAM shown in FIG. 1. FIG. 4 shows operation timings of main components in FIG. 3.

The SRAM shown in FIG. 3 is largely different from that shown in FIG. 1 with respect to the point that the clock signals K and KB are transmitted to the multiplexer MUX via the respectively corresponding clock input circuits RXK, and an output signal KCLK of the multiplexer MUX is transmitted to components via a clock tree 112. That is, the output signal KCLK of the multiplexer MUX is transmitted via the clock tree 112 to the address input buffer 101, the command input buffer 102, the data input buffer 103, the command control circuit CCTL, the write data register WDR, and the data output buffer 104. The multiplexer MUX converts the rising of the clock signal K to the rising of the output signal KCLK and converts the rising of the clock signal KB to the trailing of a clock signal internal clock signal LCLK.

In the SRAM of the QDR method, for example, in the case where the clock frequency is 333 MHz and latency between address input to data output is 1.5 cycles, data has to be output at 5 ns. In general layout, an address input buffer for fetching an address signal and a data input buffer for fetching write data are disposed in the periphery of a chip. Consequently, it takes at least 1 ns to transmit, via a clock tree, a clock signal which is input via an external terminal to a register built in the address input buffer and the data input buffer. Since 0.2 ns is necessary as a margin of setup and hold time for a clock signal of an input signal such as an address and data in the case where the clock cycle is 2 ns, in the configuration shown in FIG. 3, an input signal such as an address and data has to be delayed more than 1 ns before a register which is built in the address input buffer and the data input buffer. Consequently, in the configuration shown in FIG. 3, the frequency of a clock signal supplied to the SRAM cannot be increased for further higher speed of the SRAM.

In contrast, in the configuration shown in FIG. 1, the input DLL circuit RXDLL is provided. A clock signal whose timing is adjusted by the input DLL circuit RXDLL is distributed as an internal clock signal to the components, so that the rising timing of the internal clock signal RCC becomes almost the same as the rising timing in the input pad 24 of the clock signal K. By fine adjustment of the internal clock signal RCC on the basis of an output code of the logic circuit VDL-LOGIC, the timing that the address signal SA[n:0], command signals /R, /W, and /BW, and data D[m:0] arrive corresponding registers 721 to 726 and the timing that the internal clock signal RCC reaches the corresponding registers 721 to 726 can be made to coincide.

According to the first embodiment, the following effects can be obtained.

(1) Since the input DLL circuit RXDLL is provided and a clock signal whose timing is adjusted by the input DLL circuit RXDLL is distributed as an internal clock signal to the components, the rising timing of the internal clock signal RCC becomes almost the same as the rising timing in the input pad 24 of the clock signal K. Since setup and hold time can be shortened by adjustment of the timing of the internal clock signal, the frequency of the clock signal supplied to the SRAM can be further increased. Thus, high-speed operation and low latency of the SRAM can be realized.

(2) Since fine adjustment of the internal clock signal RCC is performed in the address input buffer 101, the command input buffer 102, and the data input buffer 103, the precision of timing of the output signal RCCint in the variable delay circuit RXVDL in the data input buffer 103 can be improved. In other words, the timing that the address signal SA[n:0], command signals /R, /W, and /BW, and data D[m:0] are input via the pads P31, P32, and P33 and reach corresponding registers 721 to 726 via the buffer RX and the timing that the internal clock signal RCC reaches the corresponding registers 721 to 726 via the delay circuit RXVDL can be made to accurately coincide.

(3) In the registers 115, 116, and 117 in the memory cell array MCA, an input signal is fetched synchronously with the trailing edge of the internal clock signal MCC. Consequently, the address signal is transmitted in 0.5 cycle from the address input buffer 101 to the memory cell array MCA. Output data of the memory cell array MCA is transmitted in one cycle to the data output buffer 104. As described above, in the registers 115, 116, and 117 in the memory cell array MCA, an input signal is fetched synchronously with a signal obtained by inverting the logic of the internal clock signal MCC, so that timing design can be performed for each of the 0.5-cycle latency region and the 1-cycle latency region. Therefore, timing design becomes relatively easy and the efficiency of circuit design can be improved.

(4) The output DLL circuit TXDLL is disposed near the power supply pads P12 and P13, and the input DLL circuit RXDLL is disposed near the power supply pads P22 and P23. With such arrangement, power supply lines for supplying the operation power supply voltages VSSDLL and VCCDLL to the output DLL circuit TXDLL and the input DLL circuit RXDLL can be shortened. Undesired noise can be suppressed from entering the output DLL circuit TXDLL and the input DLL circuit RXDLL via the power supply lines.

Second Embodiment

Figure 5:
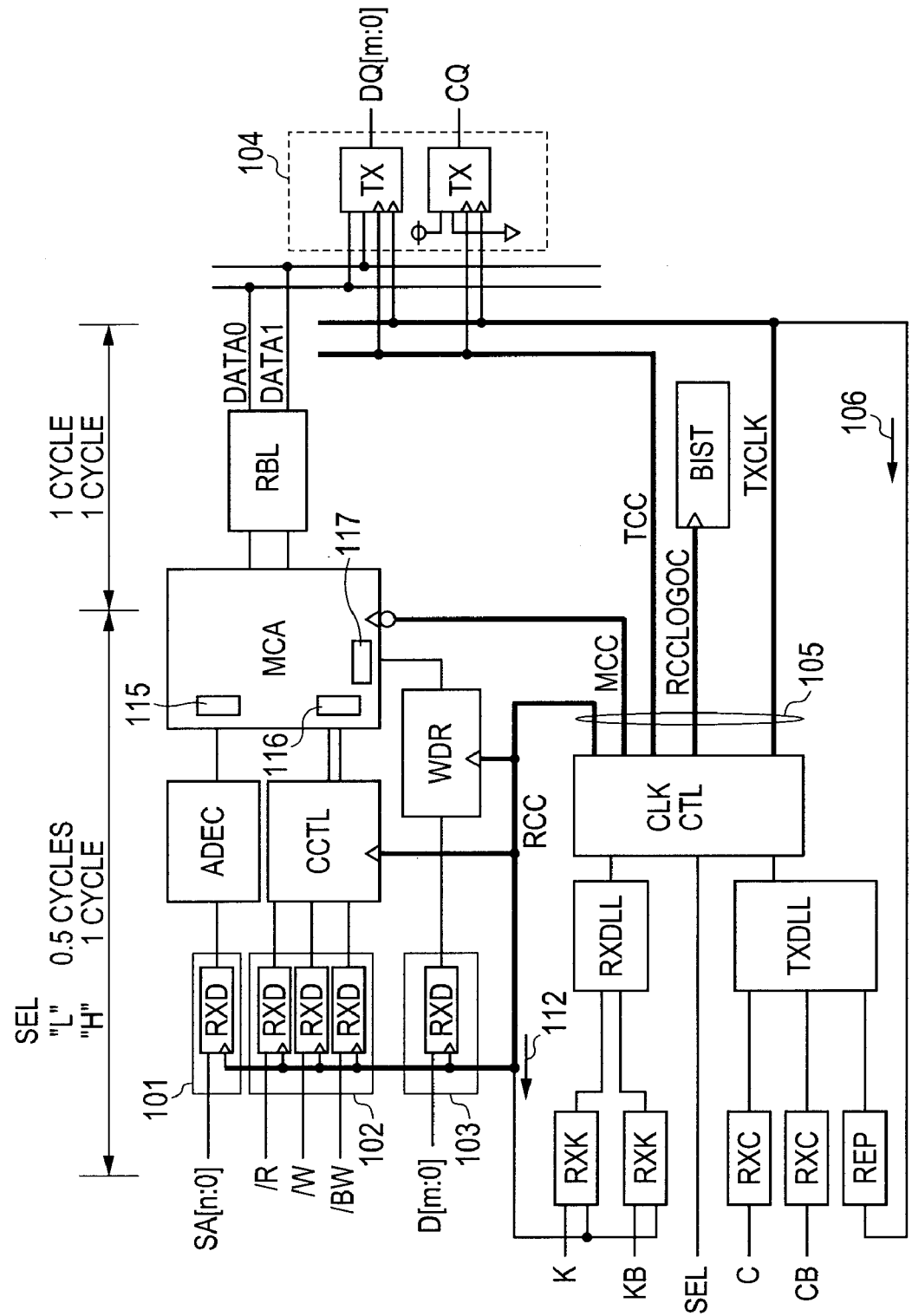
FIG. 5 is a block diagram showing another configuration example of an SRAM as an example of the semiconductor storage device according to the invention.

FIG. 5 illustrates another configuration example of an SRAM as an example of a semiconductor storage device according to the present invention.

The configuration shown in FIG. 5 is largely different from that of FIG. 1 with respect to the point that latency can be switched. The clock control circuit CLKCTL changes latency by changing delay time in a delay circuit on the inside in accordance with a latency selection signal SEL.

Figure 12:
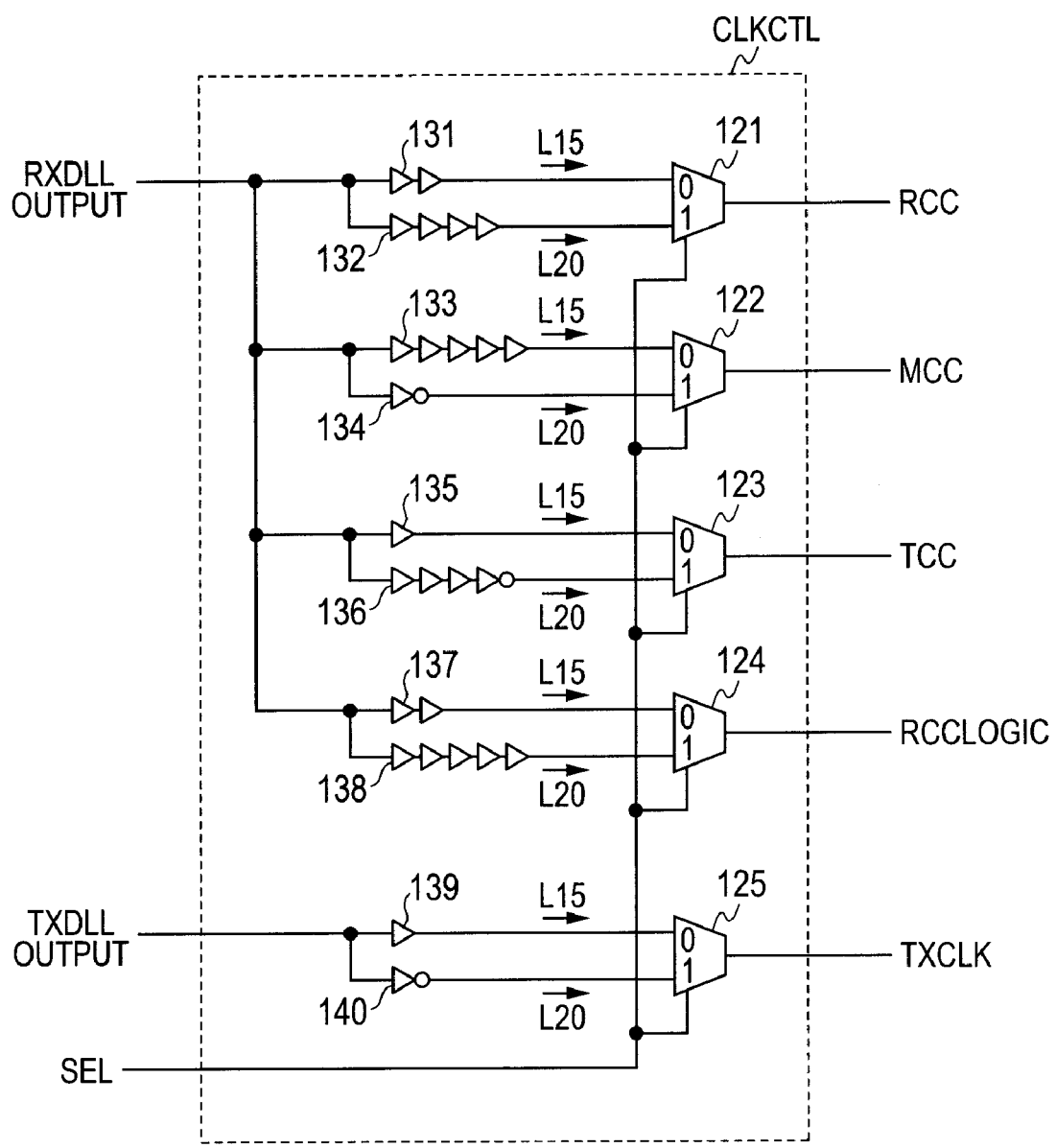
FIG. 12 is a circuit diagram showing a configuration example of main components in the SRAM illustrated in FIG. 5.

FIG. 12 shows a configuration example of the clock control circuit CLKCTL in FIG. 5.

As shown in FIG. 12, the clock control circuit CLKCTL includes a plurality of delay circuits 131 to 140 and selectors 121 to 125. The delay circuit 131 is configured by two buffers, and the delay circuit 132 is configured by four buffers. The delay circuit 133 is configured by five buffers, and the delay circuit 134 is configured by one inverter. The delay circuit 135 is configured by one buffer, and the delay circuit 136 is configured by three buffers and one inverter. The delay circuit 137 is configured by two buffers, and the delay circuit 138 is configured by five buffers. The delay circuit 139 is configured by one buffer, and the delay circuit 140 is configured by one inverter. When the latency selection signal SEL is L (logic value "0"), the selectors 121 to 125 select L15. When the latency selection signal SEL is H (logic value "1"), the selectors 121 to 125 select L20.

In the case where the latency selection signal SEL=L, the latency until data output is 1.5. In the case where SEL=H, the latency is 2.0. It is realized by selecting the path L20 in FIG. 12 by the selector when the latency selection signal SEL is H in the clock control circuit CLKCTL and inverting the phases of the internal clock signals MCC, TCC, and TXCLK. Specifically, when the latency is 1.5, an address signal is transferred in 0.5 cycle from the input pad of the address signal to the memory cell array MCA. When latency is 2.0, the address signal is transferred in 1.0 cycle from the input pad of the address signal to the memory cell array MCA. Consequently, when latency is 2.0, the clock frequency margin in transfer from the input pad of the address signal to the memory cell array MCA improves. From the memory cell array to the data output buffer 104, data is transferred in 1.0 cycle. However, in the case where latency is 2.0 in the clock control circuit CLKCTL, the timing of the internal clock signal RCC retards, the timing of the internal clock signal MCC advances, and the timing of the internal clock signal TCC retards. Therefore, the frequency margin in transfer from the memory cell array MCA to the data output buffer 104 improves.

Third Embodiment

Figure 6:
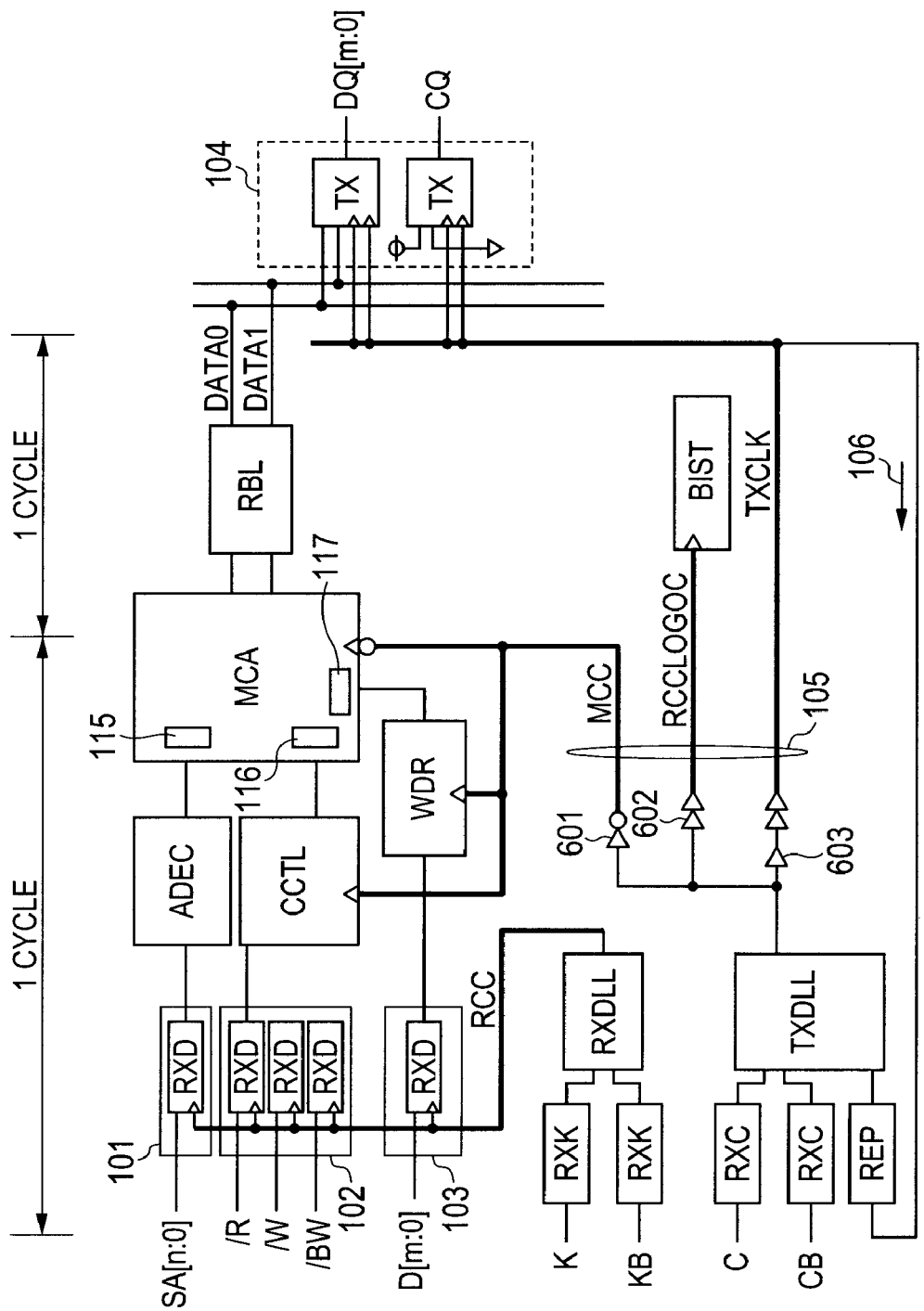
FIG. 6 is a block diagram showing another configuration example of an SRAM as an example of the semiconductor storage device according to the invention.

FIG. 6 illustrates another configuration example of an SRAM as an example of a semiconductor storage device according to the present invention.

The SRAM shown in FIG. 6 is largely different from that of FIG. 1 with respect to the point that the internal clock signal MCC is generated by using an output signal of the output DLL circuit TXDLL. The internal clock signal MCC is delayed by a delay circuit 601 and transmitted via the clock tree 105 to the command control circuit CCTL, the write data register WDR, and the memory cell array MCA. The delay circuit 601 is formed by one inverter. The internal clock control circuit RCCLOGIC is delayed by a delay circuit 602 and transmitted via the clock tree 105 to the self diagnosis circuit BIST. The delay circuit 602 is formed by two buffers. The internal clock signal TXCLK is delayed by a delay circuit 603 and transmitted to the data output buffer 104 via the clock tree 105. The delay circuit 603 is formed by three buffers.

With the configuration shown in FIG. 6, an input timing skew between the clock signals K and C is absorbed between the clock input circuit RXK and the memory cell array MCA. In this case, it is unnecessary to consider the input timing skew between the clock signals K and C in the data output buffer 104, so that the internal clock signal TCC does not have to be supplied to the data output buffer 104. Therefore, generation of the internal clock signal TCC is unnecessary.

Fourth Embodiment

Figure 11:
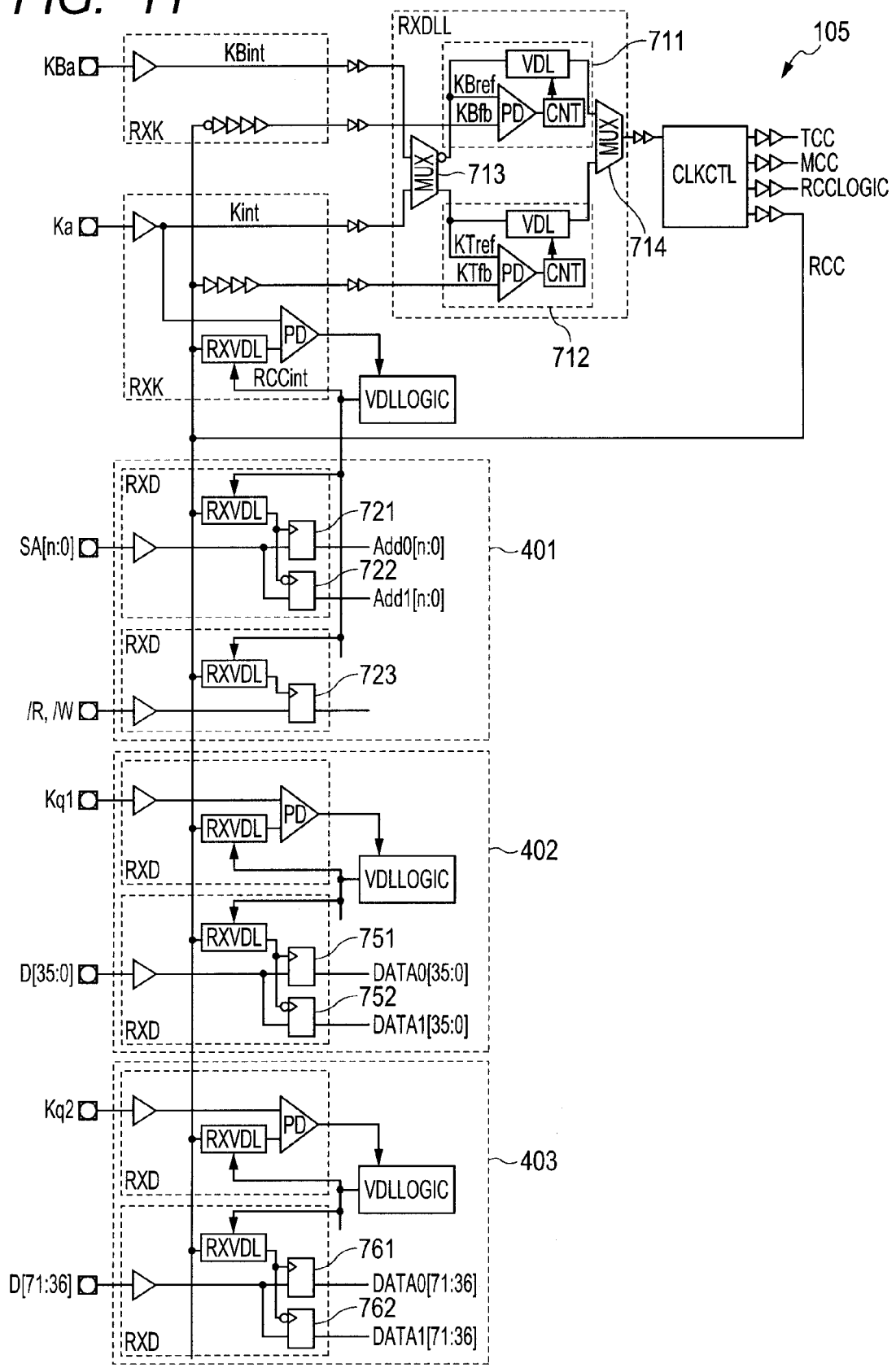
FIG. 11 is a circuit diagram showing a configuration example of main components in the SRAM illustrated in FIG. 1.

FIG. 11 illustrates another configuration example in a main part of an SRAM as an example of a semiconductor storage device according to the present invention.

The configuration shown in FIG. 11 is largely different from that of FIG. 7 with respect to the point that input buffers 401, 402, and 403 are grouped, and fetch signals synchronously with input clock signals Ka, Kq1, and Kq2 which are different from each other, respectively. In the input buffer 401, the timing that an address signal is fetched by the registers 721 and 722 and the timing that a command signal is fetched by the register 723 are finely adjusted on the basis of a result of phase comparison between the clock signal Ka and the output signal RCCint of the variable delay circuit RXVDL. In each of the input buffers 402 and 403, a dedicated logic circuit VDLLOGIC is provided. By the dedicated logic circuit VDLLOGIC, the clock signal is readjusted. Thus, fetching of data in the registers 751 and 752 and the registers 761 and 762 can be adjusted group by group.

Although the invention achieved by the inventors of the invention has been concretely described above on the basis of the embodiments, obviously, the invention is not limited to the embodiments but can be variously changed without departing from the gist of the invention.

Although an SRAM is used as the semiconductor storage device in the foregoing embodiments, the invention can also be applied to other semiconductor storage devices such as a DRAM (Dynamic Random Access Memory).

What is claimed is:
1. A semiconductor storage device comprising:
a memory cell array in which a plurality of memory cells are arranged;
a first buffer for fetching a first clock signal;
a second buffer for fetching a second clock signal which is different from the first clock signal;

a first circuit that fetches various signals used for writing/reading data to/from the memory cell array synchronously with a first internal clock signal;

a second circuit that outputs data read from the memory cell array synchronously with a second internal clock signal;

a first DLL circuit that generates the first internal clock signal by delaying the first clock signal so as to reduce a phase difference between the first clock signal fetched via the first buffer and the first internal clock signal transmitted to the first circuit; and a second DLL circuit that generates the second internal clock signal by delaying the second clock signal so as to reduce a phase difference between the second clock signal fetched via the second buffer and the second internal clock signal transmitted to the second circuit.

2. The semiconductor storage device according to claim 1, wherein a clock tree for making the first internal clock signal generated by the first DLL circuit propagate in the first circuit is included, and wherein the first DLL circuit performs phase comparison between the first internal clock signal fed back via the clock tree and the first clock signal fetched via the first buffer.

3. The semiconductor storage device according to claim 2, wherein the first buffer includes:

a delay circuit capable of delaying the first internal clock signal transmitted via the clock tree; and a phase comparison circuit for performing phase comparison between an output signal of the delay circuit and the first clock signal, and wherein the first circuit includes a variable delay circuit for finely adjusting the phase of the input first internal clock signal on the basis of a result of the phase comparison in the phase comparison circuit.

4. The semiconductor storage device according to claim 3, further comprising a logic circuit for encoding a result of phase comparison in the phase comparison circuit, wherein delay time of the variable delay circuit is controlled by an output signal of the logic circuit in the first circuit.

5. The semiconductor storage device according to claim 1, wherein the first circuit includes:

an address input buffer for fetching an address signal;

a command input buffer for fetching a command signal; and a data input buffer for fetching data to be written to the memory cell array, and wherein the second circuit includes a data output buffer capable of outputting data read from the memory cell array.

6. The semiconductor storage device according to claim 5, further comprising:

a command control circuit that controls operation of the memory cell array on the basis of a command signal fetched via the command input buffer; and a write data register for holding write data fetched via the data input buffer, wherein the command control circuit and the write data register operate synchronously with the first internal clock signal.

7. The semiconductor storage device according to claim 5, further comprising a clock controller provided between the first and second DLL circuits and the first and second circuits and capable of changing delay time of the first internal clock signal and delay time of the second internal clock signal in accordance with a latency selection signal.

8. The semiconductor storage device according to claim 5, further comprising:

a command control circuit for controlling operation of the memory cell array on the basis of a command signal fetched via the command input buffer; and a write data register for holding write data fetched via the data input buffer, wherein the command control circuit and the write data register operate synchronously with the second internal clock signal.

9. The semiconductor storage device according to claim 1, wherein the memory cell array includes:

a first register that holds an output signal of the address decoder synchronously with a clock signal for the memory cell array obtained by delaying an output signal of the first DLL circuit by predetermined time;

a second register that holds an output signal of the command control circuit synchronously with the memory cell array clock signal; and a third register that holds an output signal of the write data register synchronously with the memory cell array clock signal.

10. The semiconductor storage device according to claim 1, further comprising:

a first power supply pad for fetching power supply voltage for operating the first DLL circuit; and a second power supply pad for fetching power supply voltage for operating the second DLL circuit, wherein the first DLL circuit is disposed near the first power supply pad, and wherein the second DLL circuit is disposed near the second power supply pad.

* * * * *